US009477566B2

(12) United States Patent
Baker

(10) Patent No.: US 9,477,566 B2
(45) Date of Patent: *Oct. 25, 2016

(54) POWER LEVELING OF A SYSTEM UNDER TEST

(71) Applicant: NATIONAL INSTRUMENTS CORPORATION, Austin, TX (US)

(72) Inventor: Daniel J. Baker, Cary, NC (US)

(73) Assignee: NATIONAL INSTRUMENTS CORPORATION, Austin, TX (US)

(*) Notice: Subject to any disclaimer, the term of this patent is extended or adjusted under 35 U.S.C. 154(b) by 289 days.

This patent is subject to a terminal disclaimer.

(21) Appl. No.: 14/206,272

(22) Filed: Mar. 12, 2014

(65) Prior Publication Data

US 2014/0266243 A1    Sep. 18, 2014

Related U.S. Application Data

(60) Provisional application No. 61/782,918, filed on Mar. 14, 2013.

(51) Int. Cl.
| | | |
|---|---|---|
| G01R 21/00 | (2006.01) | |
| G06F 11/22 | (2006.01) | |
| G06F 1/30 | (2006.01) | |
| G01R 31/28 | (2006.01) | |

(52) U.S. Cl.
CPC ....... *G06F 11/2273* (2013.01); *G01R 31/2841* (2013.01); *G06F 1/30* (2013.01); *G06F 2200/261* (2013.01)

(58) Field of Classification Search
CPC .............. G06F 1/30; G06F 11/2273; G06F 2200/261; G01R 31/2841; G01R 31/2836; G01R 31/2832

USPC ........... 324/750.01; 330/2; 455/115.1, 115.2
See application file for complete search history.

(56) References Cited

U.S. PATENT DOCUMENTS

| | | | | |
|---|---|---|---|---|
| 5,966,394 A | * | 10/1999 | Spurr ...................... | H01S 5/042 372/29.015 |
| 6,703,941 B1 | * | 3/2004 | Blaker ................... | G08C 17/02 340/12.28 |
| 2008/0061877 A1 | * | 3/2008 | Adut ..................... | H03F 1/3211 330/256 |
| 2013/0218509 A1 | | 8/2013 | Schroeder et al. | |

* cited by examiner

*Primary Examiner* — Jermele M Hollington
*Assistant Examiner* — Robert P Alejnikov, Jr.
(74) *Attorney, Agent, or Firm* — Meyertons Hood Kivlin Kowert & Goetzel, P.C.; Jeffrey C. Hood; Mark S. Williams

(57) ABSTRACT

Power leveling a system under test (SUT). An input signal is provided at an initial power level to the SUT. Multiple iterations are performed, each including measuring, over a specified measuring interval, power of a signal produced by the SUT in response to the input signal, and dynamically adjusting the power of the input signal in response. The measuring interval is increased over the iterations, thereby increasing accuracy of the measuring over the iterations while converging the signal to a specified power level. An initial power leveling operation may be performed for the SUT to establish a specified power level, after which the SUT is tested, during which multiple power leveling operations are performed, each including measuring power of a signal from the SUT over a specified measuring interval, and adjusting the input signal in response, thereby maintaining the specified power level during the testing while correcting for thermal droop.

22 Claims, 13 Drawing Sheets

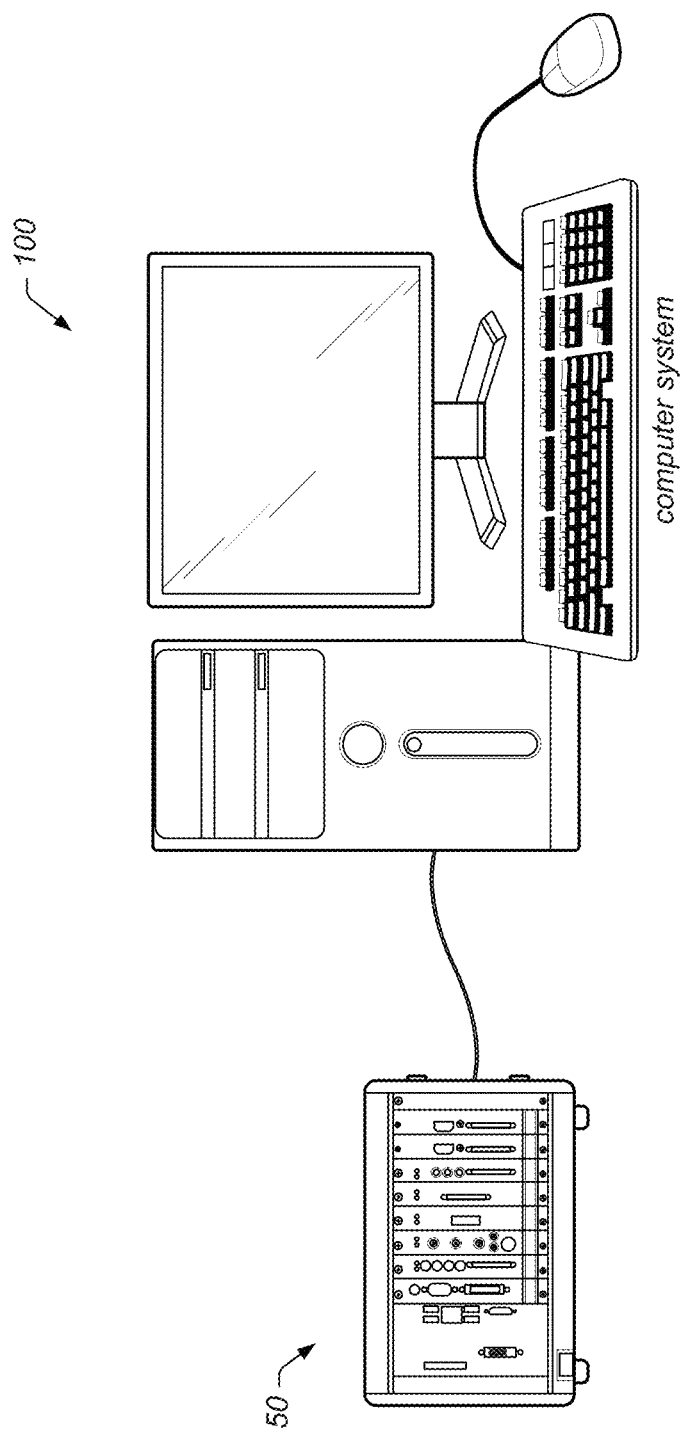

POWER LEVELING OF A SYSTEM UNDER TEST

PRIORITY DATA

This application claims priority to U.S. Provisional Appl. No. 61/782,918 filed Mar. 14, 2013, which is incorporated herein by reference in its entirety as though fully and completely set forth herein.

FIELD OF THE INVENTION

This disclosure relates to various techniques for power leveling a system under test.

DESCRIPTION OF THE RELATED ART

Achieving and maintaining power levels in testing environments can be important to obtaining accurate results and to testing time. For example, in wireless communication systems, power amplifier (PA) integrated circuits are often used to increase a signal's strength before sending it to an antenna. PA's are typically specified to have a certain performance at a particular output power level, thus it is important to test them while operating at that level. However, the gain of the PA is typically only roughly known (e.g. +/−3 dB) and is often non-linear over the operating range of the device. Therefore, when testing a PA, it may be important to "level" the PA's output to a specified power level prior to taking any performance measurements, such as, for example, error vector magnitude (EVM), adjacent channel leakage ratio (ACLR), dynamic range, or noise level measurements, among others. This process is often called power leveling or power servoing and typically involves adjusting the power of the signal going into the PA until the correct (or specified) power level is measured coming out of the PA.

In order to ensure that the PA is operating at the correct power level, a measurement has to be taken with a power measuring device. The accuracy of such measurements is typically related to the length of time over which the measurement is taken. Thus, in general, a longer measurement duration, referred to herein as "measuring interval", leads to a more accurate measurement (up to a point, of course). The measurement length should thus be set such that the measured output power of the PA is known to within some acceptable tolerance.

The servoing of the power level involves a control loop, which is typically implemented via a software connection between multiple instruments. The speed at which this control loop converges is very important because reduction in test times greatly reduces the cost of testing. The most straightforward prior art implementation of the control loop for servoing a system under test (SUT) involves these steps:
1. Specify duration of power level measurement;
2. Set the power being driven to the SUT to the appropriate level, based on the approximate gain of the SUT;
3. Wait for the generated signal to settle, and wait for the SUT to settle;
4. Measure the power level of the output of the SUT, over the specified duration, such that the accuracy of the measurement is within the desired tolerance; and
5. If the power level of the output of the SUT is not at the correct level, adjust the power being driven to the SUT and go back to step 3, else exit.

While this loop will servo the SUT to the correct level, it will do so slowly. Prior art FIG. 1 presents a graph that shows an instance of an SUT being leveled to an output power of 28 dBm, using the above prior art approach. As may be seen, each step in the loop takes about 23 milliseconds, and the total servoing time is about 150 milliseconds.

A second traditional approach to implementing the control loop is using a PID (Proportion-Integral-Derivative) technique. PID control loops are well known in the industry, and are used for implementing many types of control applications. While using a PID control algorthim for the servoing loop will work, it has several disadvantages. First, the method is servoing to a setpoint, not to a specified power level. This is a drawback in a test environment, where the goal is to ensure that the SUT is outputting the correct power level. Second, in order to guarantee that the measurement taken was accurate enough to be within the desired tolerance, the loop must be slowed down considerably. If one attempts to speed up the loop by allowing the PID coefficients to vary during the servoing, you have stability concerns and still have to perform another measurement after the loop has finished to verify that the power level is within desired tolerance. Therefore while a PID implementation is possible, it can be non-optimal in terms of test time, complexity, stability, and certainty.

SUMMARY

Embodiments of systems and method for power leveling are presented.

In one embodiment, a method for adjusting a signal provided to a system under test (SUT) may be performed, in which an input signal may be provided at an initial power level to the SUT, and a plurality of iterations performed. Each iteration may include measuring, over a specified measuring interval, power of a signal produced by the SUT in response to the input signal, and dynamically adjusting the power level of the input signal provided to the SUT based on the measuring, e.g., via adjusting a digital gain of a signal generator. Additionally, performing the plurality of iterations may include increasing the specified measuring interval over the plurality of iterations, thereby increasing accuracy of said measuring over the plurality of iterations while converging the signal to a specified power level. In one embodiment, increasing the specified measuring interval operates to converge the signal to the specified power level in substantially minimal time.

In one embodiment, the measuring may include measuring an average power of the signal over the specified measuring interval. The method may further include determining that the power of the signal produced by the SUT is within a desired range, and taking performance measurements of the SUT, e.g., testing the SUT, in response to said determining. Additionally, in some embodiments, this determining may include determining that a change in the input signal provided to the SUT over two consecutive iterations is within a specified tolerance. In other words, once the adjustment to the input signal is small enough, the system may be considered to be (power) leveled, and so is safe (or stable) for testing.

The method may further include specifying a longest specified measuring interval to be used in said increasing, e.g., via user input, and ending the plurality of iterations in response to: determining that the change in the input signal provided to the SUT over two consecutive iterations is within the specified tolerance, and upon using the longest specified measuring interval of the plurality of iterations.

In some embodiment, the method may include providing the input signal and performing the plurality of iterations multiple times using a different center frequency and/or specified power level each time.

The SUT may be any of a wide variety of devices or systems. For example, in one exemplary embodiment, the SUT is or includes a radio frequency (RF) power amplifier.

In some embodiment, increasing the specified measuring interval over the plurality of iterations may include: after an initial iteration of the plurality of iterations, for each of one or more iterations, increasing the specified measuring interval relative to the specified measuring interval of an immediately previous iteration. In other words, for at least one iteration (after the initial iteration), the specified measuring interval may be less than that of the previous iteration, even though over the plurality of iterations the specified measurement interval increases.

Embodiments of the above described method may be performed or implemented by an apparatus (or system) that includes a signal generator, configured to provide an input signal at an initial power level to a system under test (SUT), and a measurement device, configured to measure, over a specified measuring interval, power of a signal produced by the SUT in response to the input signal, where the apparatus is configured to perform a plurality of iterations, as described above. The measurement device may measure the power of the signal produced by the SUT over the specified measuring interval in response to the input signal from the signal generator, and the apparatus may dynamically adjust the power level of the input signal from the signal generator based on the measured power of the signal produced by the SUT, as per embodiments of the above method.

Embodiments of a method for continuous power leveling of an SUT (e.g., during testing) to correct for thermal droop are also presented. The SUT may be a radio frequency power amplifier, although other SUTs may be used or tested as desired. In one such embodiment, an initial power leveling operation for a system under test (SUT), thereby establishing a specified power level. After executing the initial power leveling operation, the SUT may be tested, including taking performance measurements of the SUT, e.g., determining a gain of the SUT, among others. Moreover, during this testing of the SUT, a plurality of power leveling operations for the power signal may be performed. Each of the plurality of power leveling operations may include measuring power of a signal generated by the SUT over a specified measuring interval, where the signal is generated by the SUT in response to an input signal provided to the SUT, and adjusting the input signal provided to the SUT based on the measuring. Performing the plurality of power leveling operations may operate to maintain the specified power level during the testing the SUT, thereby correcting for thermal droop.

Adjusting the input signal based on the measuring may include determining a difference between the measured power of the signal and the specified power level, and adjusting the input signal based on the difference. Adjusting the input signal provided to the SUT may use sufficiently small adjustment (e.g., in response to a given difference) such that performance of the SUT is not substantially affected.

Additionally, in some embodiments, the method may include performing the executing (of the initial power leveling operation), testing, and performing multiple times using a different center frequency provided to the SUT and different specified power level each time.

In one embodiment, measuring the output power of the signal generated by the SUT over the specified measuring interval may include accumulating raw measured power samples over the specified measuring interval.

In some embodiment, the initial power leveling operation may be or include an embodiment of the power leveling method described above. Thus, for example, executing an initial power leveling operation for a system under test (SUT) may include providing an input signal at an initial power level to the SUT, and performing a plurality of iterations, where each iteration includes measuring, over a specified measuring interval, a signal produced by the SUT in response to the input signal, and dynamically adjusting the power level of the input signal provided to the SUT based on the measuring. Additionally, as described above, performing the plurality of iterations may include increasing the specified measuring interval over the plurality of iterations, thereby increasing accuracy of the measuring over the plurality of iterations while converging the signal to a specified power level.

In some embodiments, the performing of the plurality of power leveling operations for the power signal may be controlled by a programmable hardware element. In other words, in some embodiments, at least some of the methods disclosed herein may be implemented and/or controlled in programmable hardware, such as a field programmable gate array (FPGA).

Similar to the apparatus described above, embodiments of the method for continuous power leveling may be implemented by or on an apparatus that includes a signal generator, configured to provide an input signal to a system under test (SUT), and a measurement device, configured to measure, over a specified measuring interval, power of a signal produced by the SUT in response to the input signal. In one embodiment, the measurement device may be included in a signal analyzer.

BRIEF DESCRIPTION OF THE DRAWINGS

FIGS. 3A-3C illustrate exemplary systems for implementing various embodiments;

Figure 1:
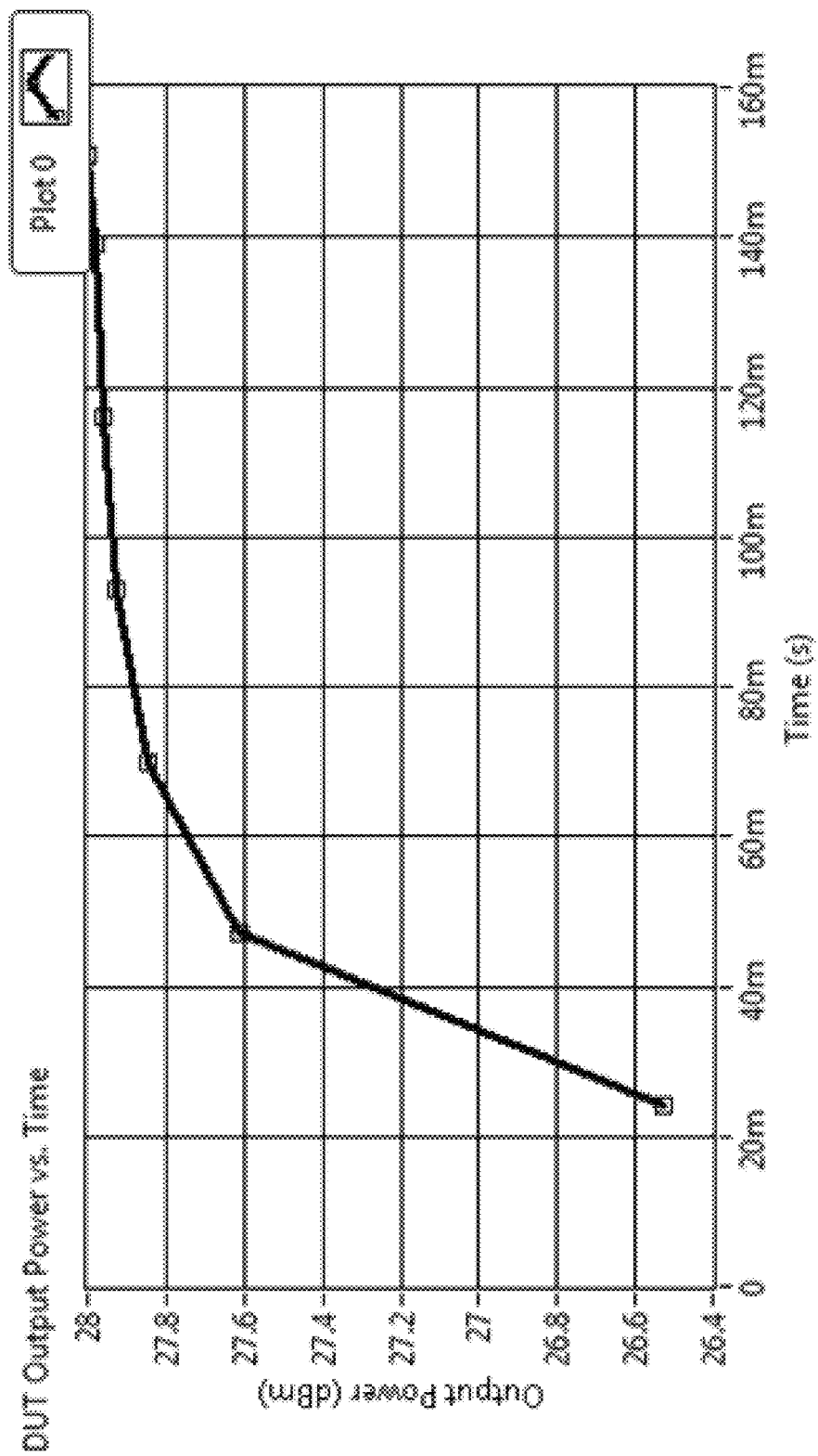
FIG. 1 illustrates power leveling, according to the prior art.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component.

As used herein, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Incorporation by Reference

The following references are hereby incorporated by reference in their entirety as though fully and completely set forth herein:

U.S. Provisional Appl. No. 61/782,918 titled "Power Leveling Techniques", filed Mar. 14, 2013.

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Pat. No. 7,210,117 titled "System and Method for Programmatically Generating a Graphical Program in Response to Program Information," filed Dec. 20, 2000.

U.S. patent application Ser. No. 13/398,529 titled "Customizing Operation of a Test Instrument Based on Information from a System Under Test," filed Feb. 16, 2012.

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning The term "program" includes 1) a software program which may be stored in a memory and is executable by a processor or 2) a hardware configuration program useable for configuring a programmable hardware element.

Graphical Program—A program comprising a plurality of interconnected nodes or icons, wherein the plurality of interconnected nodes or icons visually indicate functionality of the program. The interconnected nodes or icons are graphical source code for the program. Graphical function nodes may also be referred to as blocks.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW®, DasyLab™, DiaDem™ and Matrixx/SystemBuild™ from National Instruments, Simulink® from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks (i.e., nodes) or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks or nodes are often referred to as the block diagram portion of the graphical program.

Node—In the context of a graphical program, an element that may be included in a graphical program. The graphical program nodes (or simply nodes) in a graphical program may also be referred to as blocks. A node may have an associated icon that represents the node in the graphical program, as well as underlying code and/or data that implements functionality of the node. Exemplary nodes (or blocks) include function nodes, sub-program nodes, terminal nodes, structure nodes, etc. Nodes may be connected together in a graphical program by connection icons or wires.

Data Flow Program—A Software Program in which the program architecture is that of a directed graph specifying the flow of data through the program, and thus functions execute whenever the necessary input data are available. Data flow programs can be contrasted with procedural programs, which specify an execution flow of computations to be performed. As used herein "data flow" or "data flow programs" refer to "dynamically-scheduled data flow" and/or "statically-defined data flow".

Graphical Data Flow Program (or Graphical Data Flow Diagram)—A Graphical Program which is also a Data Flow Program. A Graphical Data Flow Program comprises a plurality of interconnected nodes (blocks), wherein at least a subset of the connections among the nodes visually indicate that data produced by one node is used by another node. A LabVIEW VI is one example of a graphical data flow program. A Simulink block diagram is another example of a graphical data flow program.

Graphical User Interface—this term is intended to have the full breadth of its ordinary meaning The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators.

Input Control—a graphical user interface element for providing user input to a program. An input control displays the value input by the user and is capable of being manipulated at the discretion of the user. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Figure 2A:
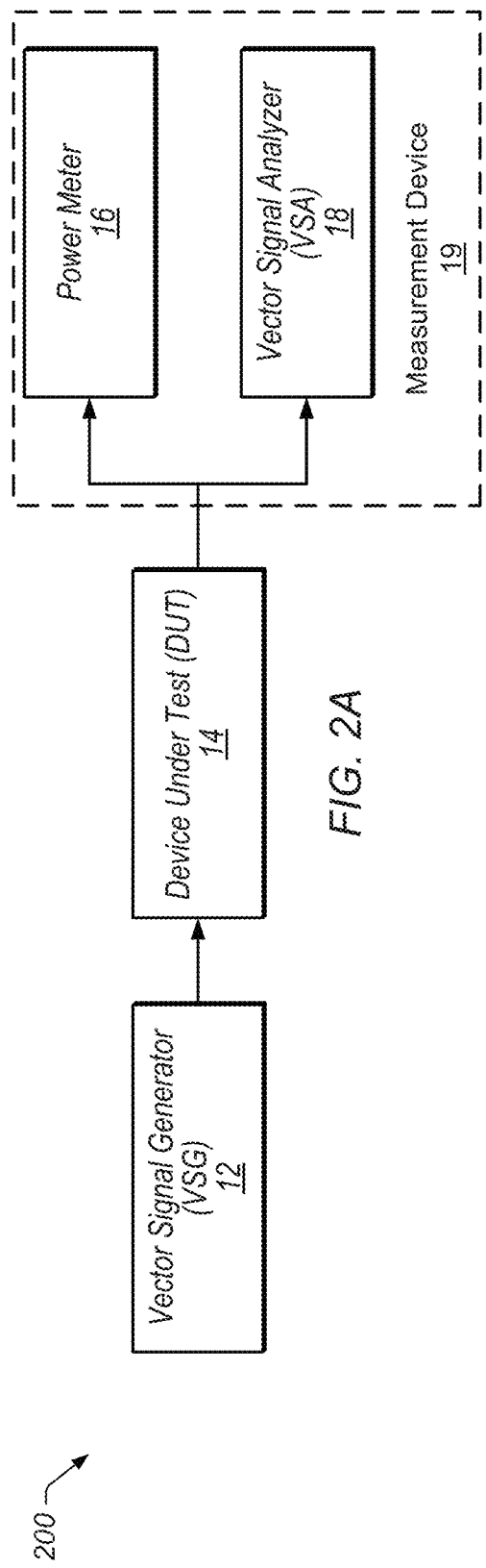
FIG. 2A is a block diagram illustrating one embodiment of a testing system.

Turning now to FIG. 2A, a block diagram illustrating one embodiment of a testing system is shown. In the illustrated embodiment, system 200 includes vector signal generator 12, which is coupled to device under test (DUT) 14 and configured to provide testing signals to DUT 14. DUT 14, in the illustrated embodiment, is in turn coupled to power meter 16 and vector signal analyzer (VSA) 18, which are configured to measure output signals from DUT 14. More generally, the power meter 16 and/or the VSA 18 may be considered to be a measurement device 19. Alternatively, in some embodiments, the VSA 18 may include a measurement device, e.g., the power meter 16, or some other device or component capable of measuring power.

Other, more detailed embodiments of testing systems according to the present techniques are described below with reference to FIGS. 3A-3C and 6A-6B.

Vector signal generator (VSG) 12, in one embodiment, is configured to generate digitally modulated signals and provide them to DUT 14. VSG 12 may produce any of various appropriate modulation formats such as quadrature amplitude modulation (QAM), frequency shift keying (FSK), binary phase shift keying (BPSK), etc. VSG 12 may also generate signals that comply with a particular standard such as GSM, W-CDMA, LTE, Wi-Fi, WiMAX, etc. In some embodiments, the output power of VSG 12 is adjustable, e.g., in response to particular power measurements by the measurement device 19, e.g., power meter 16 and/or VSA 18. VSG 12 may be configured to generate signals at multiple different frequencies and power levels during test of DUT 14.

DUT 14 may be a power amplifier for use in a wireless device, for example. In other embodiments, DUT 14 may be any of various devices tested by system 200, and may be referred to as an SUT. For example, in one embodiment, the SUT (or DUT) may be or include a radio frequency (RF) power amplifier. One or more outputs of DUT 14 may be provided to measurement device 19, e.g., to power meter 16 and VSA 18. VSA 18 may be configured to measure characteristics of the output signal from DUT 14 such as magnitude and phase at a particular frequency. In some embodiments, VSA 18 may be configured to de-modulate digitally modulated signals produced by VSG 12. Based on measurements performed by VSA 18, system 200 may be configured to determine characteristics such as error vector magnitude, signal spectrum, spectral flatness, etc. of known signals from VSG 12. In many situations, the measurements may be performed at a particular output power level of DUT 14.

For each desired frequency and output power level, system 200 may be configured to level DUT 14's output power. According to one approach, this power leveling may involve picking a starting VSG 12 output power level, e.g., based on an estimated gain of DUT 14, and waiting for the VSG 12 to settle to that level. This may be followed by waiting for the output power from DUT 14 to settle, after which the measurement device 19, e.g., power meter 16 or VSA 18, may determine if the output power level is within an acceptable range of the desired output power level. If the output power level is acceptable, measurements may be taken using VSA 18. Otherwise, a new VSG power level may be determined, and the process may proceed again until an acceptable output power level from DUT 14 is obtained. This process can be time-consuming and expensive, especially when large numbers of DUT's are tested.

Described in a slightly different way, in one embodiment, the testing system may be or include an apparatus that includes a signal generator, configured to provide an input signal at an initial power level to a system under test (SUT), and a measurement device, configured to measure, over a specified measuring interval, power of a signal produced by the SUT in response to the input signal. In some embodiments, the SUT may be or include a radio frequency power amplifier, although other SUTs and DUTs may be tested as desired. In one embodiment, the measurement device may be included in a signal analyzer, e.g., in VSA 18.

The apparatus may be configured to perform a plurality of iterations, where for each iteration: the measurement device measures the power of the signal produced by the SUT over the specified measuring interval in response to the input signal from the signal generator, and the apparatus dynamically adjusts the power level of the input signal from the signal generator based on the measured power of the signal produced by the SUT. For example, in some embodiments, the signal generator may include a digital gain control. The apparatus may be configured to increase the specified measuring interval over the plurality of iterations, thereby increasing accuracy of said measuring over the plurality of iterations while converging the signal to a specified power level. One embodiment of this technique is illustrated in FIG. 2B, described below.

Figure 2B:
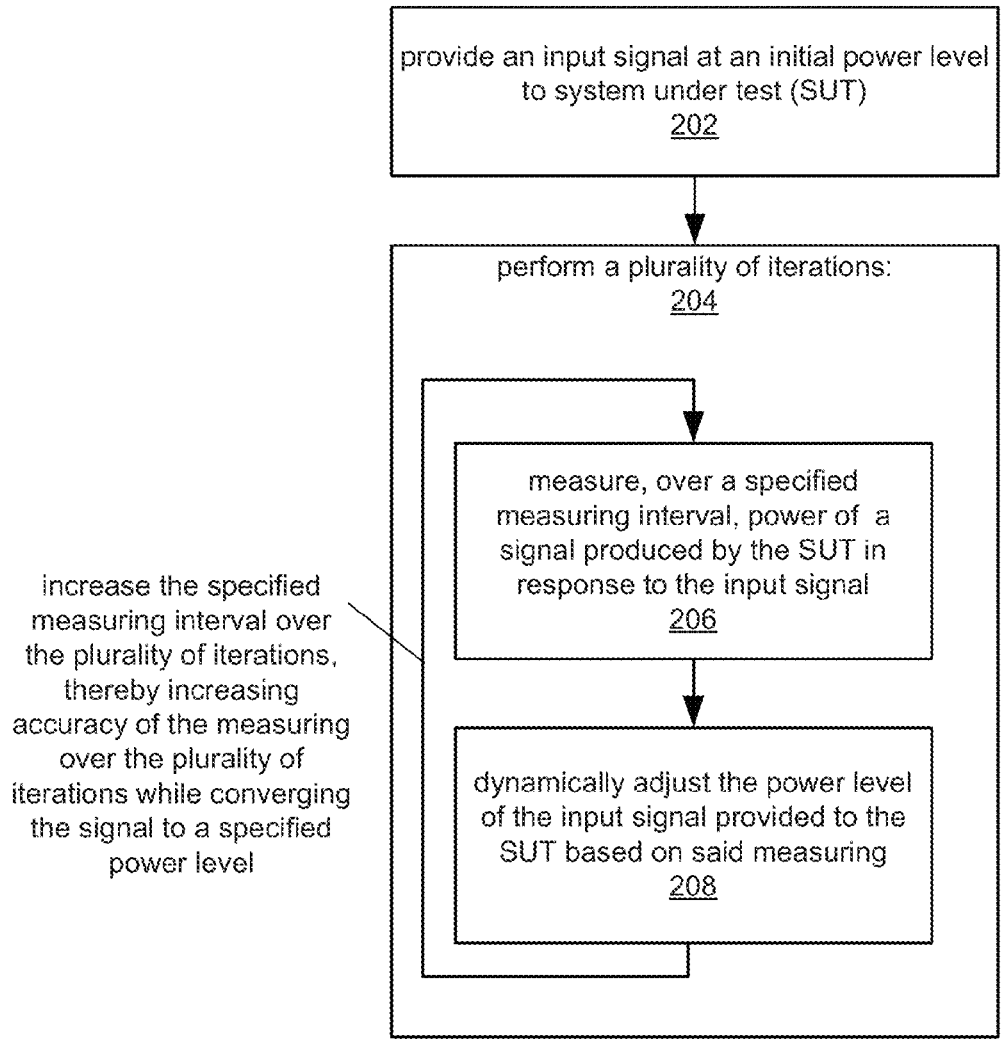
FIG. 2B is a flow diagram illustrating one embodiment of a method for power leveling.

FIG. 2B: Method for Power Leveling

FIG. 2B is a flow diagram illustrating one embodiment of a method for power leveling, including adjusting a signal provided to a system under test (SUT), which in some embodiments, may be a device under test (DUT). The method shown in FIG. 2B may be used in conjunction with any of the computer systems, devices, elements, or components disclosed herein, among other devices. In various embodiments, some of the method elements shown may be performed concurrently, in a different order than shown, or may be omitted. Additional method elements may also be performed as desired.

In 202, an input signal at an initial power level may be provided to the SUT. The initial power level may be set or determined via any of a variety of ways. For example, in one embodiment, the initial power level may be set based on an estimated gain of the SUT, historical data for the SUT or similar devices, product specifications, etc., as desired. Note that in various embodiments, the SUT may be any of a variety of systems or devices as desired. In one exemplary embodiment, the SUT is or includes a radio frequency power amplifier.

In 204, a plurality of iterations may be performed. As indicated in FIG. 2B, each iteration may include method elements 206 and 208, now described.

As shown, in 206, power of a signal produced by the SUT in response to the input signal may be measured over a specified measuring interval.

In 208, the power level of the input signal provided to the SUT may be dynamically adjusted based on said measuring (of 206).

As FIG. 2B also shows, in some embodiments, performing the plurality of iterations in 204 may include increasing the specified measuring interval over the plurality of iterations, thereby increasing accuracy of said measuring (206) over the plurality of iterations while converging the signal to a specified power level. This aspect is further illustrated in FIG. 2C, described below.

In some embodiments, a loop similar to the traditional (prior art) loop described above with reference to prior art FIG. 1 may be used, except that the loop is repeatedly updated while the DUT is settling. In some embodiments, two or more method elements in the iteration may be executed in parallel.

Note that this approach may take more steps to complete the leveling process than the prior art technique described above, but may ensure that the leveling process is completed in a minimal amount of time (within some acceptable tolerance, of course), e.g., in the smallest amount of time possible.

Figure 5A:
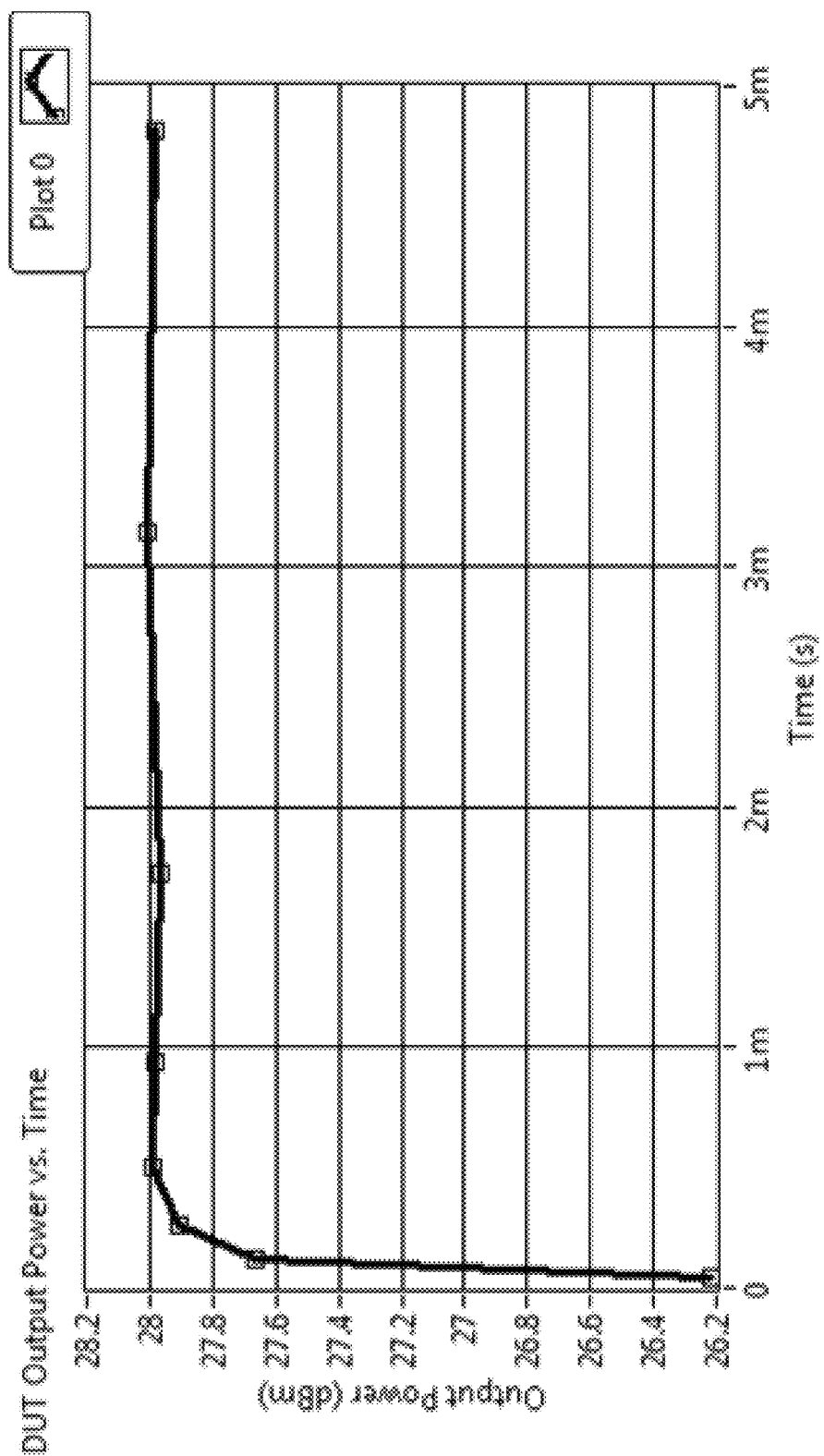
FIG. 5A is a plot illustrating exemplary power leveling, according to one embodiment.

Note that because the DUT may still be settling while each power measurement is being made, the power measurement may have some error associated with it; however, this is all part of the control loop operation and works correctly because the error decreases to (at least approximately) zero as the DUT's output power converges on being leveled. Another important difference is that the method is no longer taking a long measurement in each iteration of the loop—for the first several iterations of the loop, the gain estimate may be considerably off or different from the actual gain of the SUT, and so an averaging schedule may be employed, where the first few iterations of the loop use shorter measuring intervals (and thus execute faster but get a less accurate reading of the average power), and then as the loop starts to converge longer measuring intervals are used to get a very accurate reading of the average power. Such averages may be referred herein to as "short" and "long" averages. This increase from shorter to longer measuring intervals allows the loop to approach the leveling target very quickly, and then slow down to complete the leveling process, i.e., to converge to the target value. Exemplary results of using this technique may be seen in the graph of FIG. 5A, which illustrates leveling an SUT to an output power of 28 dBm using embodiments of the method of FIG. 2B (and/or 2C, described below), where over a plurality of iterations or leveling operations, the measurements take progressively longer. As may be seen, in this exemplary case, the total servoing time is about 5 milliseconds, e.g., the system levels out at roughly 0.5 ms, which is dramatically faster than possible with prior art techniques (see, e.g., prior art FIG. 1).

Figure 2C:
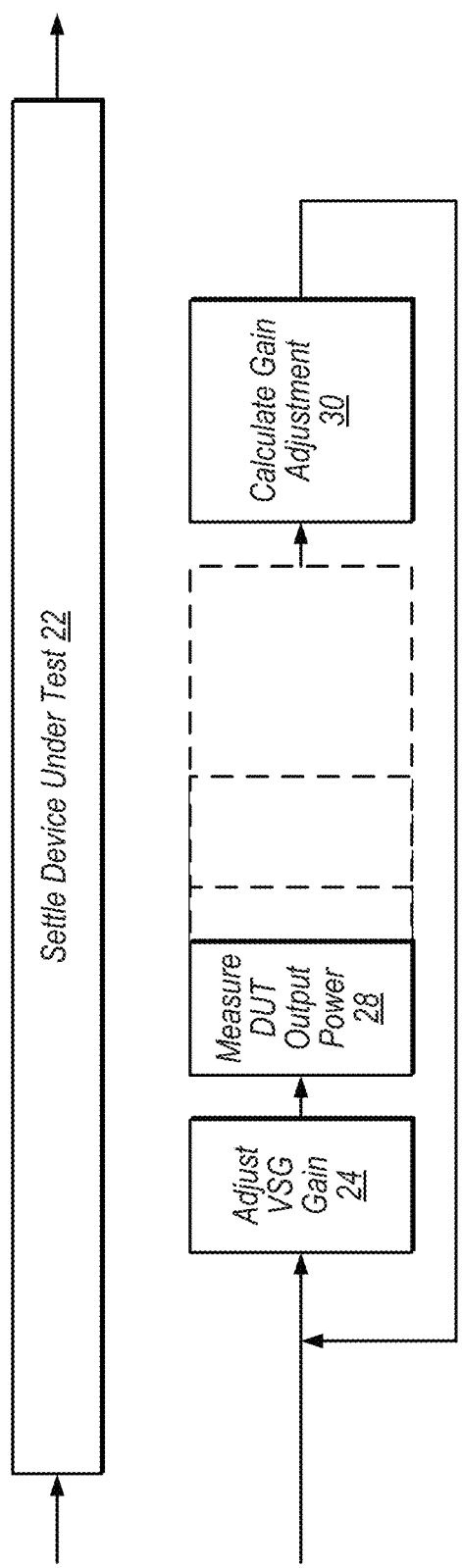
FIG. 2C is a flow diagram illustrating a more detailed embodiment of a technique for power leveling.

Turning now to FIG. 2C, a flow diagram illustrating another embodiment of a technique for power leveling a DUT 14 is shown. In the illustrated embodiment, adjusting the power output of VSG 12 (blocks 24-30) is performed in parallel with settling DUT 14 (block 22) and uses increasing measurement (or accumulation) intervals. This technique may reduce the overall time taken to power level DUT 14 for a particular desired output power level.

At block 24, the gain of VSG 12 is adjusted. In various embodiments, the power supplied to DUT 14 may be adjusted in step 24 using any appropriate technique. In one embodiment, a digital gain control is included in a digital data path of VSG 12. In this embodiment, VSG 12's power may be actually set only once, and the power supplied to DUT 14 may be adjusted by adjusting the digital gain.

At block 28, the DUT 14's output power is measured. Power meter 16 and/or VSA 18 may perform this measurement, or more generally, measurement device 19. In the illustrated embodiment, the measuring period increases in later iterations of the loop. For example, the measuring period of the first iteration may be 100 microseconds (us), followed by 200 us, 500 us, then 1 millisecond (ms) in later iterations. In other embodiments, any of various intervals may be implemented. The length of the periods may be determined according to an averaging schedule.

At block 30, a gain adjustment for VSG 12 is calculated. This adjustment may be calculated based on the current gain and the measured power from step 28, for example. In other embodiments, other types of power adjustments may be calculated (i.e., instead of adjustments to a digital gain).

Because DUT 14 is still settling while each power measurement is being made, the measurements (especially during earlier, shorter intervals) may have some associated error. However, as DUT 14's output power converges on a desired level, the error may decrease to zero. In some embodiments, the loop finishes when the measured power in step 28 is within a desired range. In other embodiments, the loop ends when the averaging schedule has reached a particular averaging time, e.g., 1 ms. At that point, if the measured power is within a desired range and the output power has changed less than a threshold difference, initial power leveling may be complete.

Further Embodiments of the Power Leveling Methods of FIGS. 2B and 2C

The following describes further embodiments of the power leveling techniques described above with reference to FIGS. 2B and 2C, although it should be noted that the embodiments described are meant to be exemplary only, and are not intended to limit the invention to any particular form, function, or appearance.

In some embodiments, increasing the specified measuring interval may operate to converge the signal to the specified power level in substantially minimal time. As used herein, the term "minimal" refers to an optimal value within a specified tolerance, where the particular acceptable tolerance may be application dependent. Thus, in various embodiments, the minimal time may be within 1% of the mathematically optimum value, within 2%, within 4%, within 5%, within 10%, and so forth, as appropriate for the application.

In one embodiment, this measuring may measure an average power of the signal over the specified measuring interval. Thus, longer measuring intervals will generally provide for more accurate measurements of the average power (over the interval).

In some embodiments, the method may further include determining that the power of the signal produced by the SUT is within a desired range, and taking performance measurements of the SUT, in response to this determining. In other words, once the power has been leveled, performance measurements for the SUT may be acquired/determined. In one embodiment, this determining may include determining that a change in the input signal provided to the SUT over two consecutive iterations is within a specified tolerance. In other words, the leveling of the SUTs output signal power may be indicated by, or may correlate with, a commensurate leveling of the input signal provided to the SUT, thus indicating that the SUT is stable and ready for performance measurements.

In one embodiment, the method may further include specifying a longest specified measuring interval to be used in the above increasing of the measuring interval. For example, a schedule may be determined or specified for increasing the measuring interval over the iterations, or, alternatively, a maximum measuring interval may be specified. In one embodiment, the method may include ending (terminating) the plurality of iterations in response to: determining that the change in the input signal provided to the SUT over two consecutive iterations is within the specified tolerance, and upon using the longest specified measuring interval of the plurality of iterations. Said another way, the iterations may stop when the input signal provided to the SUT changes less than a specified threshold amount, and upon using the longest (or maximum) specified measuring interval of the plurality of interations, e.g., when the longest specified measuring interval (or the specified longest measuring interval) has been used to measure the signal from the SUT.

In one embodiment, the method may include performing the providing the input signal and the performing the plurality of iterations multiple times using a different center frequency and/or specified power level each time. In other words, the above method may itself be performed multiple times with different respective parameter values.

In some embodiments, adjusting the level of the input signal may include adjusting a digital gain of a (or the) signal generator. Said another way, the signal generator (e.g., VSG) may include a digital gain component or module, whereby the power of the input signal generated by the signal generator may be controlled digitally.

In some embodiments, increasing the specified measuring interval over the plurality of iterations may include: after an initial iteration of the plurality of iterations, for each of one or more iterations, increasing the specified measuring interval relative to the specified measuring interval of an immediately previous iteration. In at least one embodiment, the measuring intervals may not be increased monotonically over the plurality of iterations. In other words, for at least one iteration, the measuring interval may not be increased, and may even be decreased. Of course, in some embodiments, the measuring interval may in fact be increased each iteration (after the initial iteration).

Figure 3A:
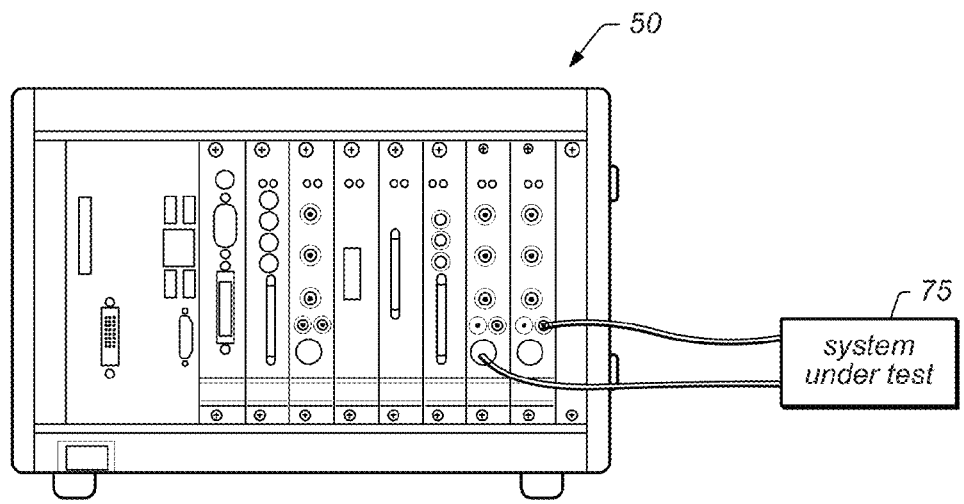
Figure 3B:
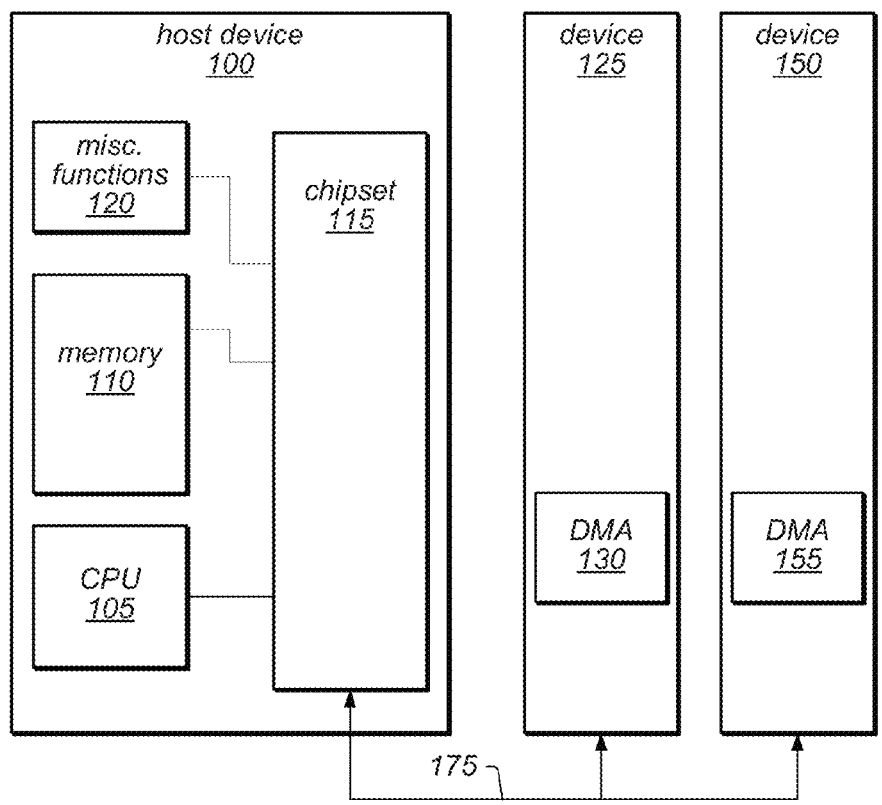

FIGS. 3A-3C illustrate exemplary systems which may implement various of the embodiments described herein. As shown in FIG. 3A, an exemplary test instrument 50 (also referred to as an "instrumentation device" or "testing device") is coupled to a system under test (SUT) 75. As used herein, a SUT covers the term "device under test" or "DUT". In the embodiment of FIG. 3A, the test instrument 50 is implemented as a chassis which is configured or operated to test the SUT 75.

The test instrument 75 may include one or more inputs and outputs for connecting to the SUT 75. The inputs and outputs may be analog, digital, radio frequency, etc., e.g., at various voltage levels and frequencies. The test instrument 75 may be configured to perform one or more tests or may implement various features for performing testing of the SUT 75. For example, the test instrument 50 may be configured to capture waveforms, calculate measured power, generate a tone at a programmed frequency, etc. The test instrument 50 may be calibrated in order to achieve a specified level of accuracy on its input/output (I/O). For example, the test instrument 50 may be configured to generate a sine wave at 1V peak-peak, within +/−10 mV of accuracy. The test instrument 50 may be configured and/or may operate in the manner described herein.

The SUT 75 may be any of various devices or systems which may be desired to be tested, such as a various radio frequency (RF) devices, semiconductor integrated circuits, consumer electronics, wireless communication devices (such as cell phones), computers, automobile electronics, energy devices, measurement devices, etc. In one embodiment, the test instrument 50 may be configured to perform various testing of the SUT 75, e.g., on signals acquired from the SUT 75. In one embodiment, the chassis may acquire measurements of the SUT 75, such as current, voltage, etc., e.g., using analog sensors, and/or digital signals using digital I/O.

FIG. 3B illustrates an exemplary block diagram of one embodiment of the test instrument 50. As shown, the test instrument 50 may include a host device 100 (e.g., a host controller board), which may include a CPU 105, memory 110, and chipset 115. Other functions that may be found on the host device 100 are represented by the miscellaneous functions block 120. In some embodiments, the host device 100 may include a processor and memory (as shown) and/or may include a programmable hardware element (e.g., a field programmable gate array (FPGA)). Additionally, one or more of the cards or devices (e.g., device 125 and/or 150) may also include a programmable hardware element as well as a direct memory access module (e.g. DMA 130 and/or DMA 155, respectively). In further embodiments, a backplane of the test instrument 50 may include a programmable hardware element. In embodiments including a programmable hardware element, it may be configured according to a graphical program as described in the various patents incorporated by reference above.

As shown, the host device 100 (e.g., the chipset 115 of the host device 100) may provide communication (e.g., PCIe communication, PXI communication, or other bus communication) to a first peripheral device 125 and a second peripheral device 150 over bus 175. The first peripheral device 125 and second peripheral device 150 may be configured to change configurations based on information provided by the host device 100, as described herein.

The devices may be any of various devices (e.g., PCIe devices), such as measurement devices (e.g., DAQ devices), processing devices, I/O devices, network devices, etc. Additionally, similar to above, the devices may include one or more programmable hardware elements or processors and memory to implement their respective functionality. In some embodiments, the devices 125 and 150 may be configured to acquire signals from the SUT 75 to perform testing. For example, the device 125 may be configured to measure and perform analog to digital conversion for voltage of the SUT 75. Similarly, the device 150 may be configured to measure and perform analog to digital conversion for current of the SUT 75. Further devices may be included in the chassis 50, such as devices for performing GPS measurements, e.g., acquiring time using GPS circuitry for synchronization purposes, among other possibilities.

In some embodiments, multiple SUTs 75 may be measured concurrently. For example, one or more devices in the test instrument 50 may be used for performing concurrent measurement, such as for RF testing, among other possibilities. Further, the test instrument 50 and/or devices included therein may be configured to perform measurements over a network, such as a wireless network (e.g., 802.11, WiMax, etc.).

FIG. 3C illustrates host device 100 as a computer system. As shown in FIG. 3A, the host device 100 may be coupled to chassis 50 (e.g., including the first device 125 and the second device 150) and may include a display device and one or more input devices. Similar to descriptions of the host device 100 above, the host may include at least one memory medium on which one or more computer programs or software components according to one embodiment of the present invention may be stored. For example, the memory medium may store one or more graphical programs which are executable to perform the methods described herein. Additionally, the memory medium may store a graphical programming development environment application used to create and/or execute such graphical programs. The memory medium may also store operating system software, as well as other software for operation of the computer system. Various embodiments further include receiving or storing instructions and/or data implemented in accordance with the foregoing description upon a carrier medium. In alternate embodiments, the chassis 50 may include a host device and the computer system may be configured to communicate with the host device in the chassis 50. For example, the computer system may be used to configure the host device in the chassis 50 and/or the devices 125 and 150 also included in the chassis 50.

In various embodiments, the host device 100 may be coupled to a second computer system or device via a network (or a computer bus). The computer systems may each be any of various types, as desired. The network can also be any of various types, including a LAN (local area network), WAN (wide area network), the Internet, or an Intranet, among others. Similarly, the host device 100 may be coupled to the test instrument 50 via various mechanisms. In some embodiments, the test instrument may include a memory medium that stores program instructions implementing embodiments of the techniques disclosed herein.

Power Leveling and Thermal Droop

Figure 5B:
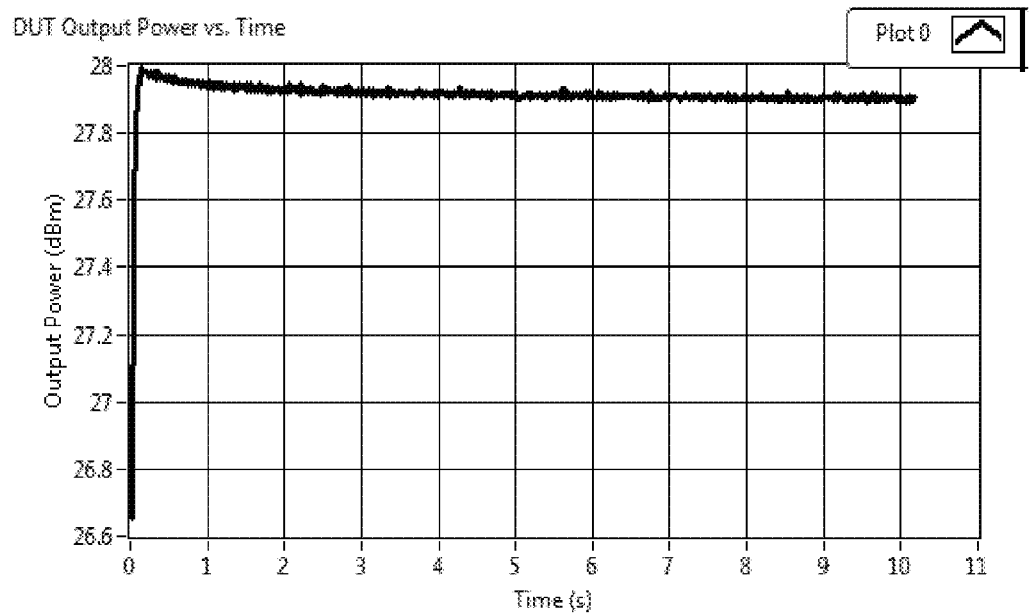
FIGS. 5B and 5C are plots illustrating exemplary thermal droop without and with continuous power leveling, respectively.

One physical phenomenon associated with some power amplifiers is that the gain continues to decrease for some time after the initial leveling is complete. This is known as thermal droop, or a thermal tail. FIG. 5B illustrates this effect on a DUT (or SUT) using a prior art or traditional leveling method. As shown, the output of the DUT is leveled, and then the signal generator's output level is held constant while performance measurements are taken. More specifically, the output was leveled to 28 dBm in about 150 ms, and then as the signal generator's output level was held constant the PA's output power drooped by 0.1 dB over the next 10 seconds. Note that the entire thermal tail for this example DUT is in fact much longer than 10 seconds, and continues to droop slowly for several minutes.

Thus, the DUT's output power drops after initial leveling even though the signal generator's power output is held constant. Said another way, the gain of the DUT may continue to decrease for some time after initial leveling is complete. This phenomenon may continue as long as several minutes after initial power leveling. One prior art technique for correcting for thermal droop involves waiting until the "steep" part of the droop curve has passed (e.g., around the 2 s point in FIG. 5B) and then making performance measurements. However, this approach may not fully account for the droop and the waiting wastes time.

Figure 4A:
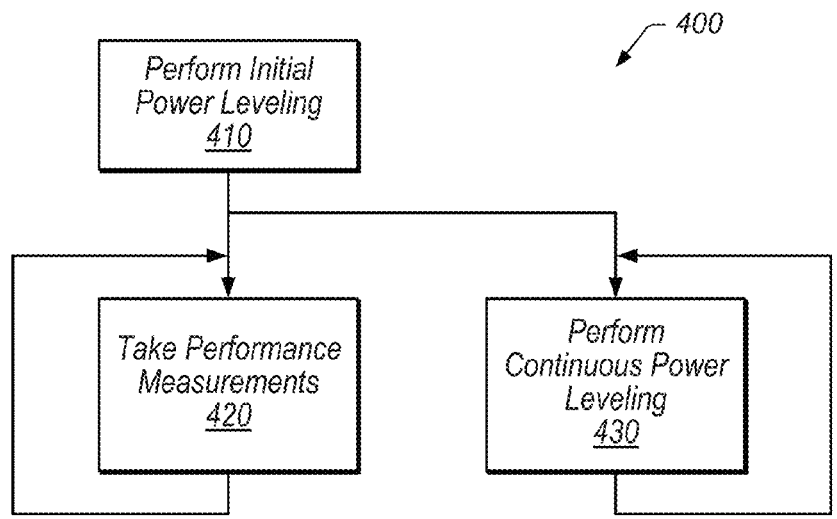
FIG. 4A is a flow diagram illustrating one embodiment of a method for continuous power leveling while correcting for thermal droop.

Turning now to FIG. 4A, a flow diagram illustrating one embodiment of a method 400 for power leveling while correcting for thermal droop is shown. The method shown in FIG. 4A may be used in conjunction with any of the computer systems, devices, elements, or components disclosed herein, among other devices. In various embodiments, some of the method elements shown may be performed concurrently, in a different order than shown, or may be omitted. Additional method elements may also be performed as desired. Flow begins at block 410.

At block 410, initial power leveling may be performed. In one embodiment, system 200 performs initial power leveling as described above with reference to FIG. 2B and/or 2C. For example, executing an initial power leveling operation for the DUT (or SUT) may include providing an input signal at an initial power level to the DUT, performing a plurality of iterations, where each iteration includes measuring, over a specified measuring interval, a signal produced by the SUT in response to the input signal, and dynamically adjusting the power level of the input signal provided to the SUT based on the measuring. Moreover, performing the plurality of iterations may include increasing the specified measuring interval over the plurality of iterations, thereby increasing accuracy of the measuring over the plurality of iterations while converging the signal to a specified power level.

Note that in this embodiment, droop may actually be more pronounced than for slower initial leveling techniques, because initial leveling occurs so fast and less of the droop occurs during initial leveling. In some embodiments, the power leveling method of FIG. 2B and/or 2C may be artificially extended by performing the leveling loop additional times after the desired output power level is achieved. In other embodiments, the power leveling of FIG. 2B and/or 2C may proceed as quickly as possible to reach a desired power level, e.g., in substantially minimal or optimal time, in order to proceed to the method of FIG. 4A. Said another way, increasing the specified measuring interval may operate to converge the signal to the specified power level in substantially minimal time. Flow proceeds in parallel to blocks 420 and 430.

At block 420, performance measurements may be taken. For example, VSA 18 may determine various performance measurements from a DUT (or SUT), such as, for example, but not limited to: error vector magnitude (EVM), adjacent channel leakage ratio (ACLR), dynamic range, or noise level measurements, among others. As illustrated, these measurements may be taken while continuous power leveling is occurring (block 430). Flow ends at block 420.

At block 430, continuous power leveling is performed. As used herein, the phrase "continuous power leveling" refers to power leveling that occurs while measurements (e.g., performance measurements) are being taken during testing of a DUT. Continuous power leveling may not involve actually measuring or adjusting power continuously throughout an interval, but typically involves performing multiple iterations of a power leveling looped periodically or at varying intervals, e.g., with gaps in time in between leveling loops. In block 430, VSA 18 measures DUT 14 output power in parallel with taking measurements from DUT 14. In response to the measured output power, the gain of VSG 12 is adjusted to correct for droop. This control loop is similar to the loop of FIG. 2C, except that it occurs while other measurements are being taken during testing of DUT 14. Flow ends at block 430.

In some embodiments, gain adjustments are calculated differently for continuous leveling than for initial leveling, e.g., because smaller gain adjustments are desired during continuous leveling. The calculations for gain adjustments may include scaling factors and knowledge of the number of samples taken in order to avoid certain multiplications and divisions in a programmable hardware element (e.g., in the embodiments of FIG. 6, described below). For example, an FPGA may accumulate raw ADC data of a particular number of samples rather than actually averaging the data (in order to avoid performing division) and may implement scaling factors to convert to decibel measurements of power to avoid certain multiplication steps.

Figure 4B:
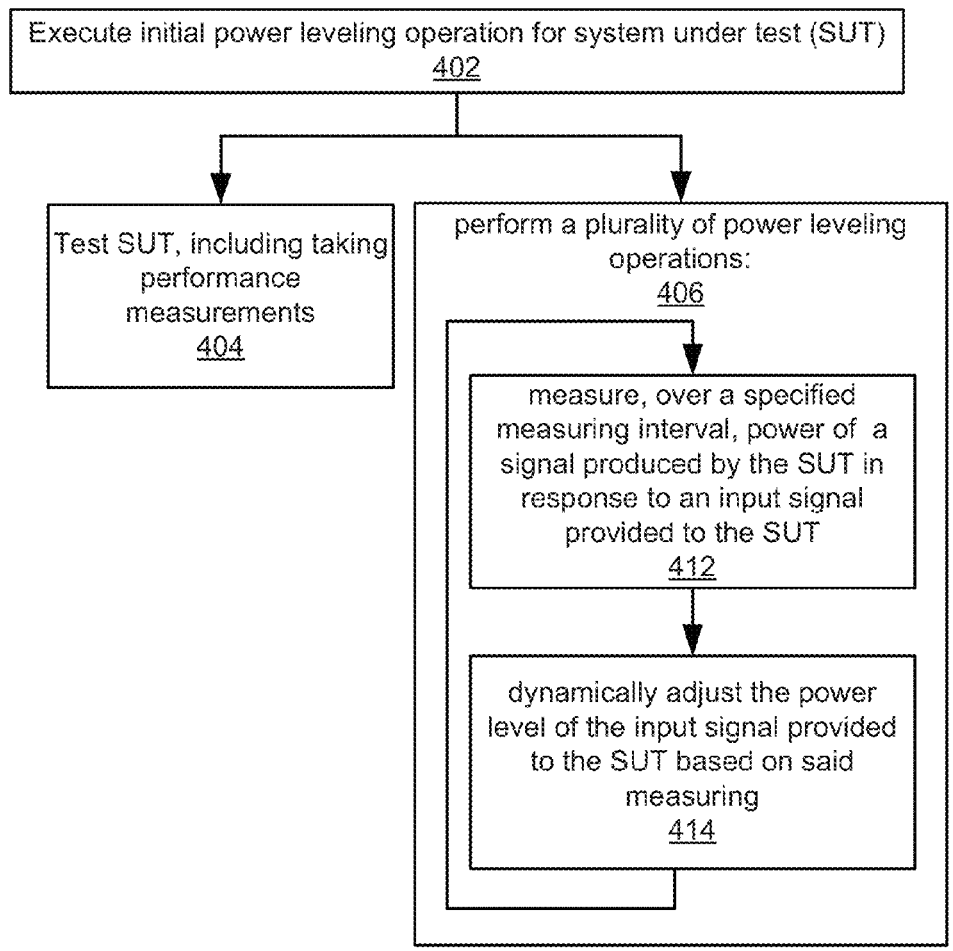
FIG. 4B is a flow diagram illustrating another embodiment of a method for continuous power leveling while correcting for thermal droop.

FIG. 4B is a flow diagram illustrating another embodiment of a method for power leveling while correcting for thermal droop. The method shown in FIG. 4B may be used in conjunction with any of the computer systems, devices, elements, or components disclosed herein, among other devices. In various embodiments, some of the method elements shown may be performed concurrently, in a different order than shown, or may be omitted. Additional method elements may also be performed as desired. Flow begins at block 402.

As FIG. 4B shows, in 402, initial power leveling may be performed, e.g., similar to that of 410 of the method of FIG. 4A, i.e., where in one embodiment, system 200 performs initial power leveling as described above with reference to FIG. 2B and/or 2C. For example, as with method element 410 above, executing an initial power leveling operation for the SUT (or DUT) may include providing an input signal at an initial power level to the SUT, performing a plurality of iterations, where each iteration includes measuring, over a specified measuring interval, a signal produced by the SUT in response to the input signal, and dynamically adjusting the power level of the input signal provided to the SUT based on the measuring, and where performing the plurality of iterations includes increasing the specified measuring interval over the plurality of iterations, thereby increasing accuracy of said measuring over the plurality of iterations while converging the signal to a specified power level.

As also described above with respect to 410, in some embodiments, the power leveling method of FIG. 2B and/or 2C may be artificially extended by performing the leveling loop additional times after the desired output power level is achieved, and also similarly, in other embodiments, the power leveling of FIG. 2B and/or 2C may proceed as quickly as possible to reach a desired power level, e.g., in substantially minimal or optimal time, in order to proceed to the method of FIG. 4B, i.e., increasing the specified measuring interval during the initial power leveling of 402 may operate to converge the signal to the specified power level in substantially minimal time.

In 404, the SUT (which in some embodiments, may be a DUT) may be tested after executing the initial power leveling operation of 402. This testing may include taking performance measurements of the SUT such as, for example, but not limited to: error vector magnitude (EVM), adjacent channel leakage ratio (ACLR), dynamic range, or noise level measurements, among others, as mentioned above.

In 406, a plurality of power leveling operations for the power signal may be performed during the testing of the SUT (404). Each of the plurality of power leveling operations may include: measuring power of a signal generated by the SUT over a specified measuring interval, where the signal is generated by the SUT in response to an input signal provided to the SUT, and adjusting the input signal provided to the SUT based on the measuring. Performing the plurality of power leveling operations may operate to maintain the specified power level during testing of the SUT, thereby correcting for thermal droop.

Further Embodiments

The following describes further embodiments of the methods implementing power leveling while correcting for thermal droop, using embodiments of the novel techniques described above with respect to FIGS. 4A and 4B, although it should be noted that the embodiments described are meant to be exemplary only, and are not intended to limit the invention to any particular form, function, or appearance.

In one embodiment, testing the SUT may include determining a gain of the SUT.

As noted above, in some embodiments, the SUT may be or include a radio frequency (RF) power amplifier.

In some embodiments, adjusting the input signal based on the measuring of the power of the signal generated by the SUT (or DUT) may include determining a difference between the measured power of the signal and the specified power level, and adjusting the input signal based on the difference. Moreover, adjusting the input signal provided to the SUT in response to a given difference may use a sufficiently small adjustment such that performance of the SUT is not substantially affected.

For example, the adjustment to the signal may be small enough to constrain resultant changes in SUT performance, such as, but not limited to, changes in one or more of error vector magnitude (EVM), adjacent channel leakage ratio (ACLR), dynamic range, or noise level measurements, to less than 0.1%, 0.2%, 0.5%, 1%, 2%, etc., depending on the particular application. More generally, the impact or effect on performance of the SUT may be constrained to be within some specified tolerance. Thus, in one particular example, the adjustment to the signal may be less than or equal to 0.001 dB. Of course, any other values may be used as appropriate for the specified tolerance.

In one embodiment, the method (e.g., of FIG. 4A or 4B) may include performing the executing, testing, and performing multiple times using a different center frequency provided to the SUT and different specified power level each time.

Additionally, in some embodiments, measuring the output power of the signal generated by the SUT over the specified measuring interval may include accumulating raw measured power samples over the specified measuring interval. More generally, it should be noted that any of the techniques disclosed with respect to any of the methods and systems disclosed herein may be used with any other of the methods and systems described.

Figure 5C:
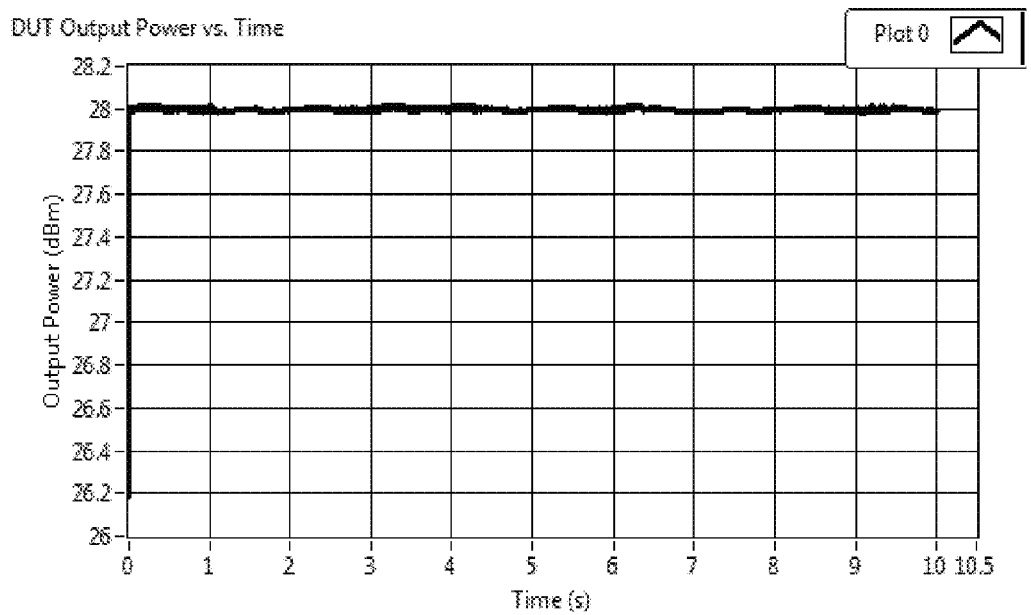

Turning now to FIGS. 5B and 5C, two exemplary plots of DUT output power versus time during testing of a DUT are shown. In FIG. 5B, thermal droop occurs after initial leveling of DUT. As shown, the DUT output power slowly droops (e.g., the gain decreases) over time. In contrast, FIG. 5C shows a plot of DUT output power versus time when continuous power leveling is performed. In this plot, because the power provided to the DUT is gradually adjusted over time during testing, thermal droop is largely corrected.

The following describes further embodiments of systems implementing power leveling using embodiments of the novel techniques disclosed herein, although it should be noted that the embodiments described are meant to be exemplary only, and are not intended to limit the invention to any particular form, function, or appearance.

Note that in various different embodiments, the techniques disclosed herein may be implemented in a variety of different ways. The following describes further embodiments of systems implementing power leveling using embodiments of the novel techniques disclosed herein, although it should be noted that the embodiments described are meant to be exemplary only, and are not intended to limit the invention to any particular form, function, or appearance.

For example, in one exemplary embodiment, embodiments of the method of FIG. 2B, 2C, 4A, and/or 4B, may be implemented via or performed by an embodiment of the system described in U.S. application Ser. No. 13/398,529, titled "Customizing Operation of a Test Instrument Based on Information from a System Under Test", which was incorporated by reference above.

Figure 6B:
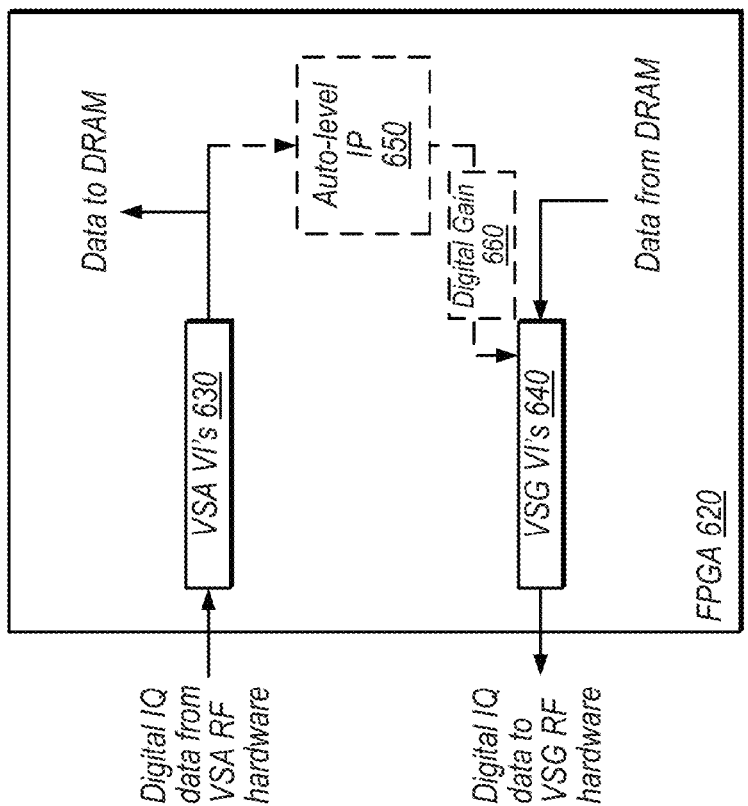
FIG. 6B is a diagram illustrating one configuration of a field-programmable gate array.
Figure 6A:
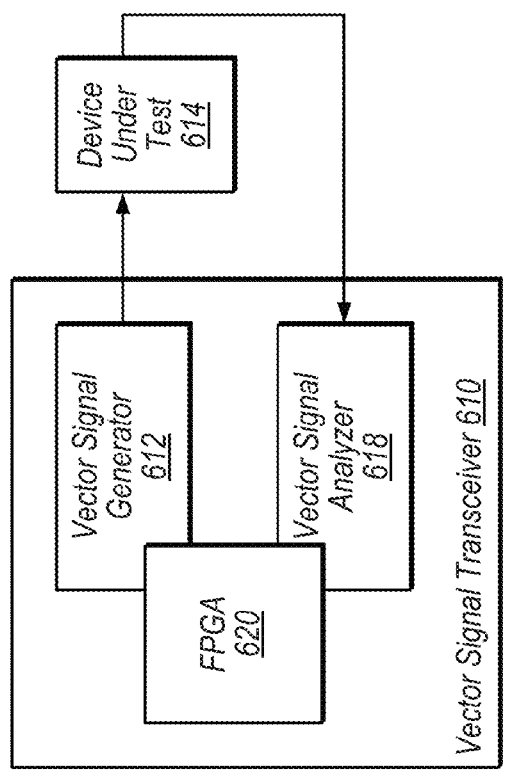
FIG. 6A is a block diagram illustrating one embodiment of a vector signal transceiver.

Turning now to FIG. 6A, a block diagram illustrating one embodiment of a vector signal transceiver (VST) 610 is shown. In the illustrated embodiment, VST 610 includes FPGA 620, VSG 612, and VSA 618, and is coupled to DUT 614. In various embodiments, VST 610 may be configured to perform embodiments of the functionality described above for system 200, e.g., as described with reference to FIGS. 2B, 2C, 4A, and/or 4B.

Although there is no power meter shown in FIG. 6A, in some embodiments, a power meter may be used to initially transfer the accuracy of the power meter to VSA 618. After initial calibration, VSA 618 may be configured to measure power in signals received from DUT at various times, e.g., for power leveling loops. VSA 618 may include analog to digital converters (ADC's) to sample signals from DUT 614. VSG 612 may include digital to analog converters (DAC's) to produce signals for DUT 614. FPGA 620 may be programmable to implement various power-leveling techniques using the hardware of VSG 612 and VSA 618.

More generally, in some embodiments, an apparatus may be provided that includes a signal generator, configured to provide an input signal to a system under test (SUT), and a measurement device, configured to measure, over a specified measuring interval, power of a signal produced by the SUT in response to the input signal. The apparatus may be configured to perform embodiments of the method of FIG. 4A and/or FIG. 4B. Note that these methods may further include performing embodiments of the method of FIG. 2B and/or 2C.

Turning now to FIG. 6B, a block diagram illustrating one exemplary embodiment of FPGA 620 is shown. In the illustrated embodiment, FPGA 620 is configured to implement VSA virtual instruments (VI's) 630, VSG virtual instruments (VI's) 640, and auto-level IP 650. While VI's are typically graphical programs, e.g., graphical data flow programs such as per the LabVIEW™ graphical programming system provided by National Instruments Corporation, it should be noted that in other embodiments, other types of programs may be used as desired, e.g., text-based programs. Thus, the VI-related descriptions herein are meant to be exemplary only, and embodiments of the techniques implemented thereby may be implemented via any programs or programming systems desired.

VSG VI's 640 may be used to configure VSG 612 hardware to generate particular test signals. VSA VI's 630 may be used to configure VSA 618 hardware to measure particular characteristics of signals received from DUT 14. Auto-level IP 650 may be used to configure power leveling, e.g., the initial power leveling of FIG. 2B or 2C and/or the continuous power leveling of FIG. 4A or FIG. 4B. As shown, auto-level IP 650 may be coupled to (or include) a digital gain component 660 that may be coupled to (or in some embodiments, may include) a digital gain block or component 660 that may adjust the digital gain of VSG 612. This adjustment may occur during initial power leveling and/or during continuous power leveling. Auto-level IP 650 may be executed in parallel with VSA VI's 630 and VSG VI's 640 and may be performed without interfering with testing of DUT 614.

Running auto-level IP 650 in the FPGA inside VST 640 may reduce the time required to make each adjustment to the power supplied by VSG 612. Auto-level IP 650 may quickly receive average power measured by VSA 618 and adjust the gain of VSG 612. An FPGA implementation is illustrated for exemplary purposes, but in other embodiments, FPGA 620 may be any of various appropriate programmable hardware elements.

Following the above exemplary approach, in one embodiment, a method for customizing a test instrument may include storing code for implementation on a programmable hardware element of the test instrument that specifies an adaptive behavior for the test instrument, e.g., as described above with reference to the methods of FIGS. 2B, 2C, 4A, and/or 4B. A hardware description for the programmable hardware element may be generated and implemented, where the test instrument is configured to determine an output power level received from an SUT coupled to the test instrument during testing of the SUT. Operation of the test instrument may be automatically modified based on the adaptive behavior and the output power level received from the SUT during testing of the SUT. For example, in one embodiment, operation of the test instrument may be automatically modified to adjust the input signal provided to the SUT based on the measured output power level from the SUT.

Moreover, the code for implementation may be specified in one or more graphical program portions comprising a plurality of nodes connected by wires, where the plurality of nodes visually represent functionality of the one or more graphical program portions, and where receiving user input specifying customization may include receiving user input modifying the one or more graphical program portions.

Thus, in some embodiments, the continuous power leveling technique of FIGS. 4A and 4B may be implemented in hardware, e.g., via an FPGA or other programmable hardware element(s).

Thus, in various embodiments, a user may be able to customize or configure both the configuration and code of the host software as well as the configuration and code of the firmware, implemented on a programmable hardware element. As noted above, U.S. patent application Ser. No. 13/398,529 titled "Customizing Operation of a Test Instrument Based on Information from a System Under Test," provides various systems and techniques that may be used to customize operation of FPGA 620 for power leveling.

FIGS. 7A-7D illustrate exemplary graphical programs that in some embodiments may be used during operation of VST 640 to program parameters of averaging schedules for initial and/or continuous power leveling. As noted above, these graphical implementations are meant to be exemplary only, and other types of programs may be used as desired, e.g., text-based programs.

Figure 7A:
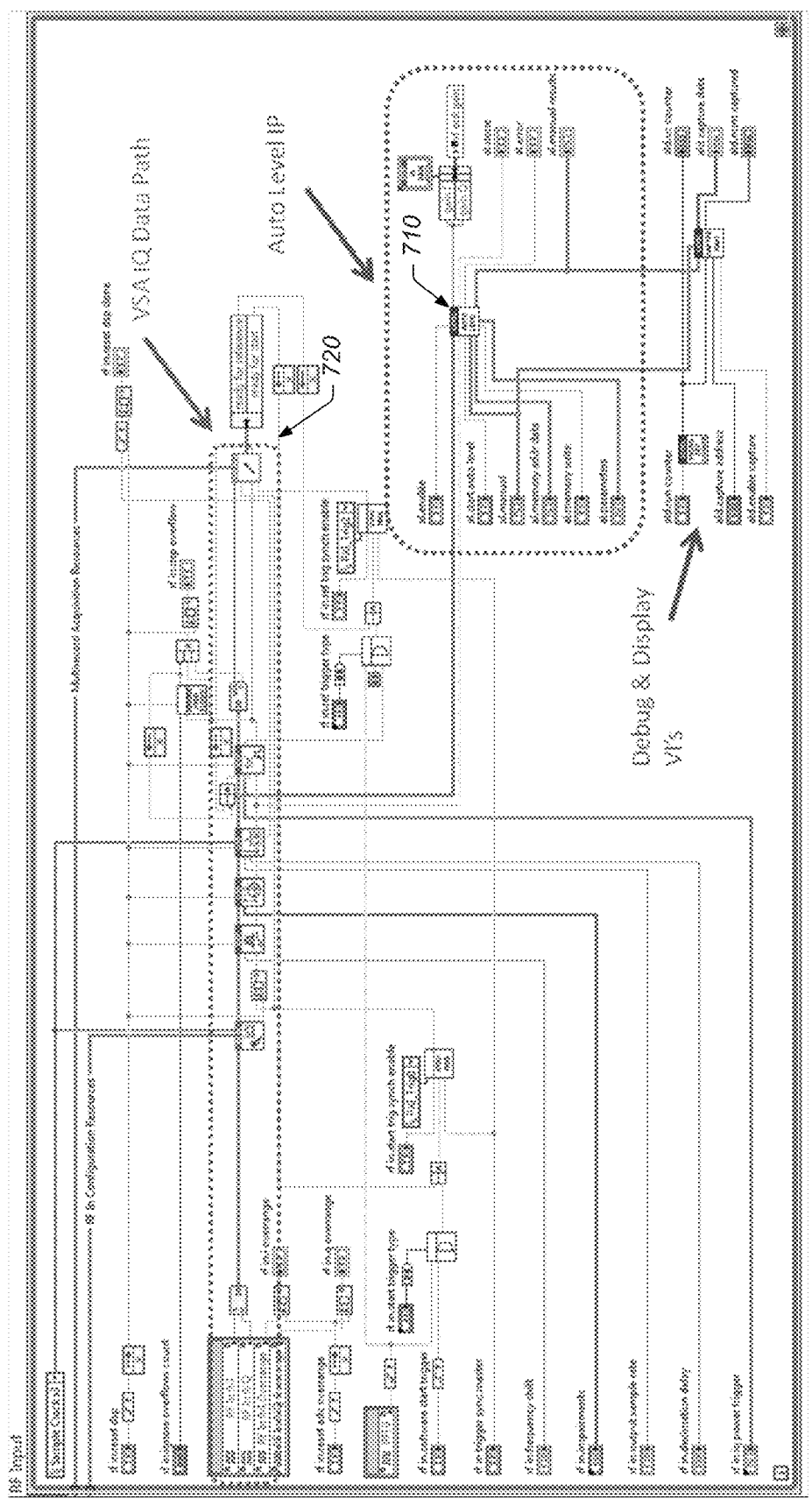
FIGS. 7A-7D illustrate the use of graphical programs for configuring power leveling for a test instrument, according to one embodiments.

FIG. 7A includes an auto-level VI 710 (here represented by a graphical program function node labeled "Level—Auto Level") that is placed in parallel with VSA IQ data path 720. The IQ data is split and sent to an acquisition VI and to auto-level VI 720. One of the outputs of the auto-level VI is a new digital gain value, which is sent to a new digital gain via in a VSG data path. In one embodiment, the indicated VSA IQ data path 720 (see long dotted rounded rectangle) may correspond to the VSA VI's 630 of FIG. 6B. Similarly, the indicated auto level IP block (which includes the auto-level VI 710), labeled "Auto Level IP", may correspond to the Auto-level IP 650 component of FIG. 6B. As also shown, in this exemplary implementation, various "Debug & Display VI's" are also provided, which may operate to allow the user to view and debug the programs.

Figure 7B:
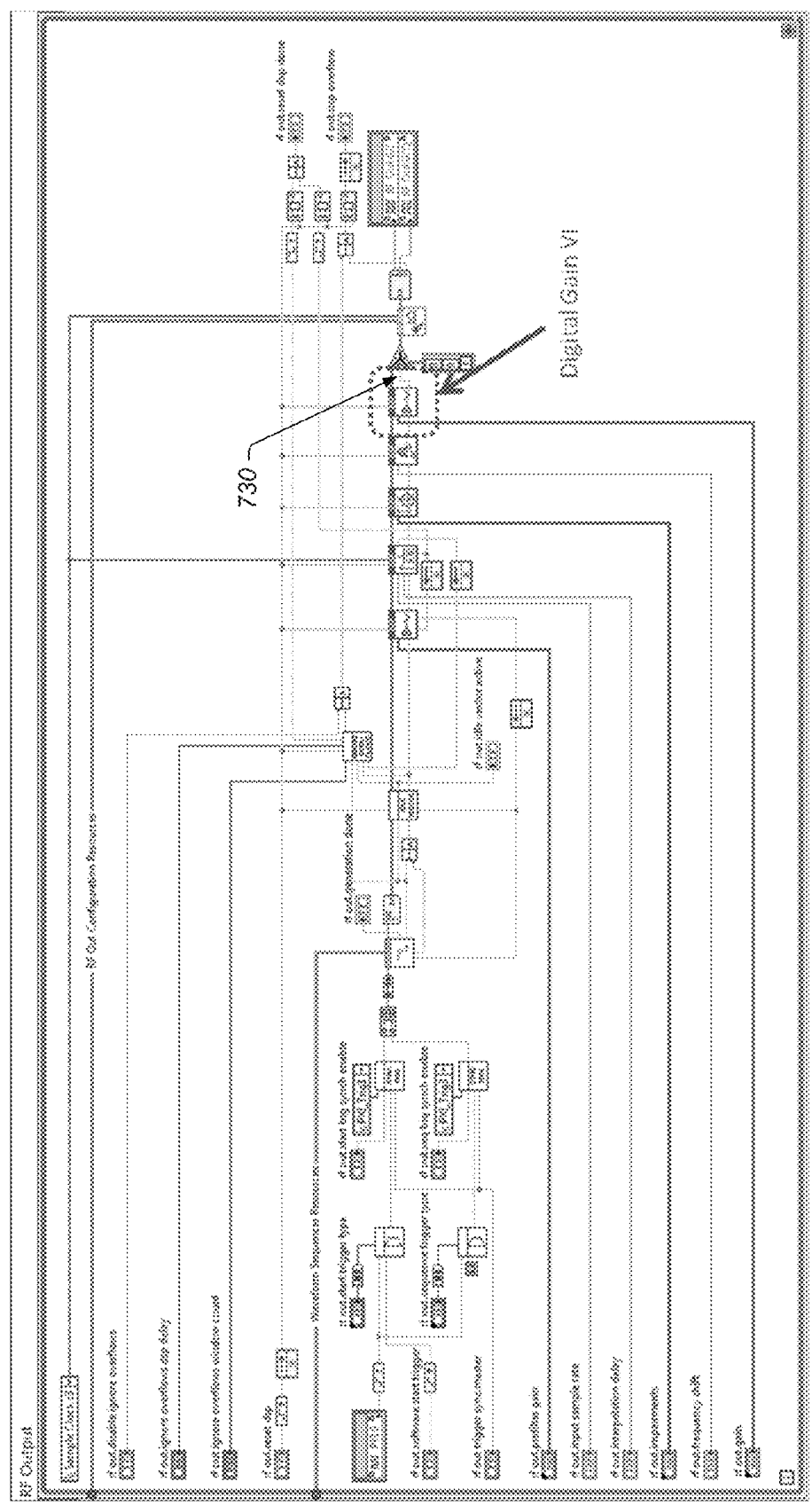

FIG. 7B illustrates an exemplary graphical program (or VI) that includes a digital gain VI 730 (labeled "Digital Gain VI") that receives the new digital gain value (using a local variable in the illustrated example). In one embodiment, when the digital gain value is set to 1, then no change is made to normal VSG output. However, the digital gain value can be adjusted to linearly control the VSG's output level. In some embodiments, the digital gain VI may correspond to the digital gain component 660 of FIG. 6B.

Figure 7D:
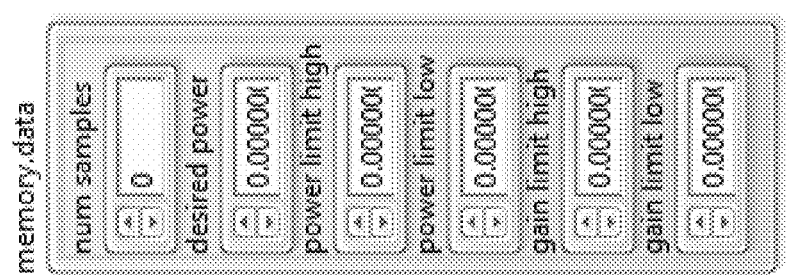
Figure 7C:
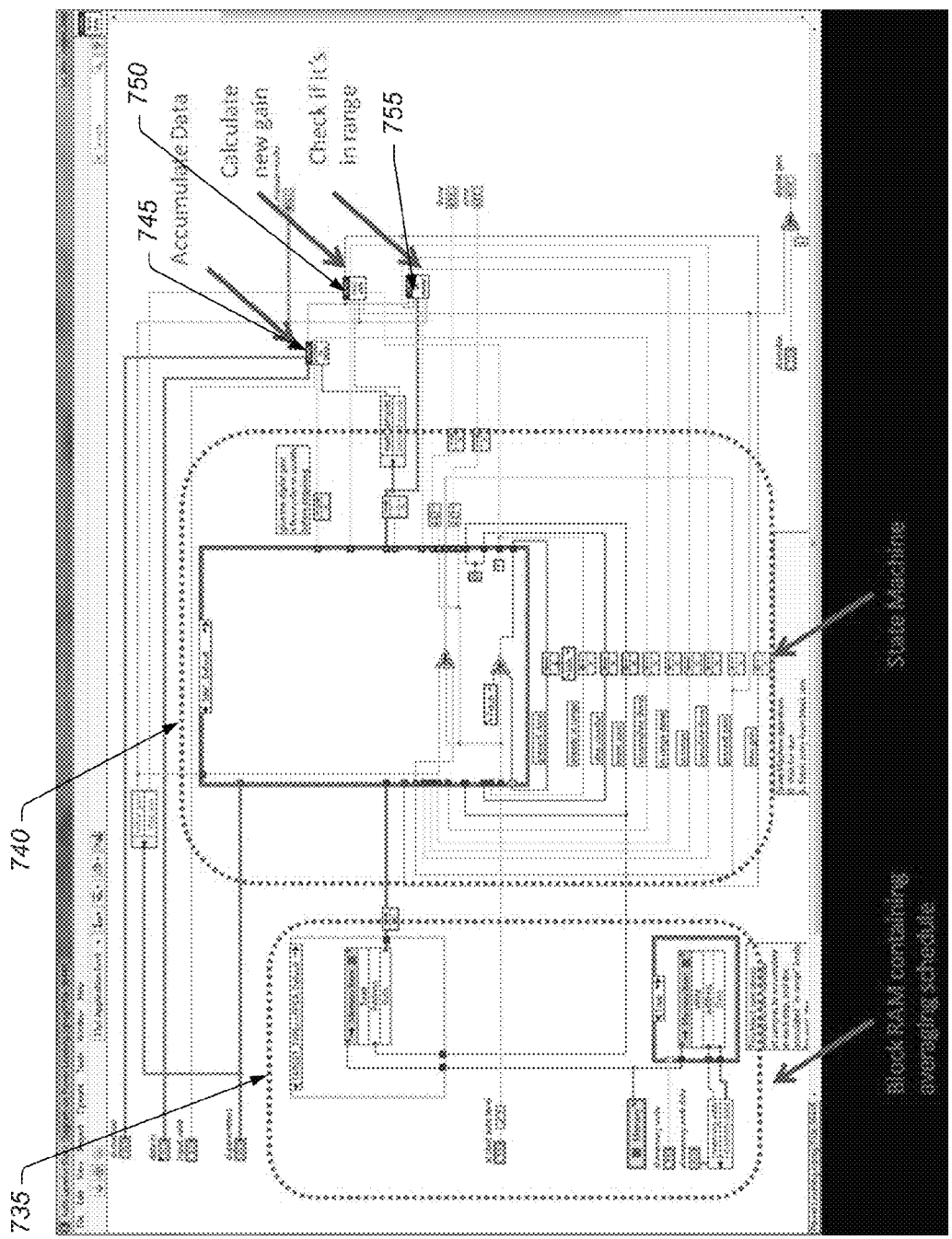

FIG. 7C shows exemplary (graphical program) code inside (or included in) the auto-level VI 710 of FIG. 7A, i.e., implementing at least some, and possibly all, of the functionality of the auto-level VI 710. In this exemplary embodiment, the code includes or implements a state machine 740, with an averaging schedule stored in block RAM 735. In the illustrated embodiment, VI 710 also includes VI's 745, 750, and 755 for accumulating data from the output of a DUT, checking if measured power is in range, and calculating a new digital gain value, respectively. In one exemplary embodiment, the state machine may implement the following operations:

(1) Wait for start;
(2) Fetch next averaging schedule entry from block RAM;
(3) Start "accumulate," (measurements) wait until done;
(4) Start "calculate," wait until done; and
(5) Check if in range.

If operating in continuous mode (e.g., performing continuous leveling) and the measurement is in range, the gain may be updated and the state machine may return to step (2). Otherwise, if the measurement is in range, leveling may be finished and the state machine may return to step (1). If the measurement is not in range and a maximum number of iterations of the schedule has been reached, the digital gain may be set to a default value, an error may be returned, and the state machine may return to step (1). If the measurement is not in range and a maximum number of iterations of the schedule has not been reached, the digital gain may be updated and the state machine may return to step (2). In one embodiment, step (2) may fetch a new entry from the block RAM 835 until it gets to a last entry, which it may continue fetching until the state machine is reset to step (1). This entry may include the longest measuring period of the averaging schedule.

FIG. 7D shows the averaging schedule parameters stored in block RAM 735, according to one exemplary embodiment. In this example embodiment, the "num samples" parameter sets the length of averaging for this step (e.g., the measuring interval or duration of method element 206 of FIG. 2B or 28 of FIG. 2C). In one embodiment, in order to avoid having to divide by the number of samples in the FPGA, the other parameters (desired power, power limit high, power limit low) may be a function of the number of samples, i.e., of parameter num samples, and may be stored along with the num samples parameter in block RAM 835. These parameters may be used to determine whether an accumulation of samples (measurements) indicates a measured power within an acceptable range. In some embodiments, additional VI's may be used to create the averaging schedule of FIG. 7D by entering testing parameters such as, but not limited to, number of samples, desired output power, desired accuracy of DUT output power, limits on the digital gain control, etc. The graphical programs illustrated in FIG. 7A-7D may be used to program VST 740 to implement initial and/or continuous power leveling for a particular DUT. Of course, in other embodiments, the VST may be programmed using any kind of program(s) desired.

\* \* \*

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

I claim:

1. A method for adjusting a signal provided to a system under test (SUT), the method comprising:
   providing an input signal at an initial power level to the SUT; and
   performing a plurality of iterations, wherein each iteration includes:

measuring, over a specified measuring interval, power of a signal produced by the SUT in response to the input signal; and dynamically adjusting the power level of the input signal provided to the SUT based on said measuring;

wherein said performing the plurality of iterations comprises:

increasing the specified measuring interval over the plurality of iterations, thereby increasing accuracy of said measuring over the plurality of iterations while converging the signal to a specified power level.

2. The method of claim 1, wherein said measuring comprises measuring an average power of the signal over the specified measuring interval.

3. The method of claim 1, wherein said increasing the specified measuring interval operates to converge the signal to the specified power level in substantially minimal time.

4. The method of claim 1, further comprising:
determining that the power of the signal produced by the SUT is within a desired range; and
taking performance measurements of the SUT, in response to said determining.

5. The method of claim 4, wherein said determining comprises:
determining that a change in the input signal provided to the SUT over two consecutive iterations is within a specified tolerance.

6. The method of claim 5, further comprising:
specifying a longest specified measuring interval to be used in said increasing; and
ending the plurality of iterations in response to:
said determining that the change in the input signal provided to the SUT over two consecutive iterations is within the specified tolerance; and
upon using the longest specified measuring interval of the plurality of iterations.

7. The method of claim 1, further comprising:
performing said providing the input signal and said performing the plurality of iterations multiple times using a different center frequency and/or specified power level each time.

8. The method of claim 1, wherein the SUT comprises a radio frequency power amplifier.

9. The method of claim 1, wherein said adjusting the level of the input signal includes adjusting a digital gain of a signal generator.

10. The method of claim 1, wherein said increasing the specified measuring interval over the plurality of iterations comprises:
after an initial iteration of the plurality of iterations, for each of one or more iterations, increasing the specified measuring interval relative to the specified measuring interval of an immediately previous iteration.

11. An apparatus, comprising:
a signal generator, configured to provide an input signal at an initial power level to a system under test (SUT); and
a measurement device, configured to measure, over a specified measuring interval, power of a signal produced by the SUT in response to the input signal;
wherein the apparatus is configured to perform a plurality of iterations, wherein for each iteration:
the measurement device measures the power of the signal produced by the SUT over the specified measuring interval in response to the input signal from the signal generator; and
the apparatus dynamically adjusts the power level of the input signal from the signal generator based on the measured power of the signal produced by the SUT;
wherein the apparatus is configured to increase the specified measuring interval over the plurality of iterations, thereby increasing accuracy of said measuring over the plurality of iterations while converging the signal to a specified power level.

12. The apparatus of claim 11, wherein said measuring power comprises measuring an average power of the signal over the specified measuring interval.

13. The apparatus of claim 11, wherein said increasing the specified measuring interval operates to converge the signal to the specified power level in substantially minimal time.

14. The apparatus of claim 11, wherein the apparatus is further configured to:
determine that the power of the signal produced by the SUT is within a desired range; and
take performance measurements of the SUT, in response to said determining.

15. The method of claim 14, wherein said determining comprises:
determining that a change in the input signal provided to the SUT over two consecutive iterations is within a specified tolerance.

16. The apparatus of claim 11, further comprising:
a programmable hardware element, configured to control performance of the plurality of iterations and the dynamic adjusting of the specified measuring intervals over the plurality of iterations.

17. The apparatus of claim 11, wherein the apparatus is further configured to:
after an initial iteration of the plurality of iterations, for each of one or more iterations, increase the specified measuring interval relative to the specified measuring interval of an immediately previous iteration.

18. The apparatus of claim 11, wherein the apparatus is further configured to:
perform the plurality of iterations multiple times using a different center frequency and specified power level each time.

19. The apparatus of claim 11, wherein the measurement device is included in a signal analyzer.

20. The apparatus of claim 11, wherein the SUT comprises a radio frequency power amplifier.

21. The apparatus of claim 11, wherein the signal generator includes a digital gain control.

22. A non-transitory computer-readable storage medium having instructions stored thereon that are executable by a computing device to perform:
providing an input signal at an initial power level to the SUT;
performing a plurality of iterations, wherein each iteration includes:
measuring, over a specified measuring interval, power of a signal produced by the SUT in response to the input signal; and
dynamically adjusting the power level of the input signal provided to the SUT based on said measuring;
wherein said performing the plurality of iterations comprises:
increasing the specified measuring interval over the plurality of iterations, thereby increasing accuracy of said measuring over the plurality of iterations while converging the signal to a specified power level.

\* \* \* \* \*